(12) United States Patent
Iida et al.

(10) Patent No.: US 9,400,345 B2
(45) Date of Patent: Jul. 26, 2016

(54) CIRCULAR POLARIZING PLATE AND ORGANIC ELECTROLUMINESCENCE PANEL

(71) Applicant: NITTO DENKO CORPORATION, Ibaraki-shi, Osaka (JP)

(72) Inventors: Toshiyuki Iida, Ibaraki (JP); Takashi Shimizu, Ibaraki (JP); Nao Murakami, Ibaraki (JP); Kazuki Uwada, Ibaraki (JP); Tadashi Kojima, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/407,247

(22) PCT Filed: Jun. 24, 2013

(86) PCT No.: PCT/JP2013/067956
§ 371 (c)(1),
(2) Date: Dec. 11, 2014

(87) PCT Pub. No.: WO2014/003189
PCT Pub. Date: Jan. 3, 2014

(65) Prior Publication Data
US 2015/0160387 A1 Jun. 11, 2015

(30) Foreign Application Priority Data
Jun. 29, 2012 (JP) ................................. 2012-146707

(51) Int. Cl.
*G02B 5/30* (2006.01)
*G02B 1/08* (2006.01)
*H01L 51/52* (2006.01)

(52) U.S. Cl.
CPC *G02B 5/305* (2013.01); *G02B 1/08* (2013.01); *G02B 5/3025* (2013.01); *G02B 5/3083* (2013.01); *H01L 51/5281* (2013.01)

(58) Field of Classification Search
CPC .... G02B 5/305; G02B 5/3025; G02B 5/3083; G02B 1/08; H01L 51/5281
USPC ................ 359/488.01, 489.07; 313/504, 112; 349/96, 117
See application file for complete search history.

(56) References Cited

U.S. PATENT DOCUMENTS

| | | |
|---|---|---|
| 6,565,974 B1 | 5/2003 | Uchiyama et al. |
| RE39,753 E | 7/2007 | Uchiyama et al. |

(Continued)

FOREIGN PATENT DOCUMENTS

| | | |
|---|---|---|
| CN | 101065693 A | 10/2007 |
| CN | 101454699 A | 6/2009 |

(Continued)

OTHER PUBLICATIONS

International Search Report dated Sep. 17, 2013 issued in corresponding application No. PCT/JP2013/067956.

(Continued)

*Primary Examiner* — Frank Font
(74) *Attorney, Agent, or Firm* — Westerman, Hattori, Daniels & Adrian, LLP

(57) ABSTRACT

There is provided a circularly polarizing plate that can prevent light leakage in an organic EL panel and can suppress the warping of the panel to reduce reflection unevenness in a panel surface. A circularly polarizing plate according to an embodiment of the present invention is used in an organic EL panel, and includes a polarizer and a retardation film directly bonded to the polarizer. In-plane retardations of the retardation film satisfy a relationship of $Re(450) < Re(550)$; and a 90° adhesive strength between the polarizer and the retardation film is 1.0 N/20 mm or more.

17 Claims, 2 Drawing Sheets

(56) References Cited

U.S. PATENT DOCUMENTS

| | | |
|---|---|---|
| 7,906,216 B2 | 3/2011 | Yaegashi et al. |
| 8,293,861 B2 | 10/2012 | Motoyoshi et al. |
| 8,314,987 B2 | 11/2012 | Goto et al. |
| 8,320,042 B2 | 11/2012 | Goto et al. |
| 8,379,169 B2 | 2/2013 | Kitagawa et al. |
| 8,411,360 B2 | 4/2013 | Kitagawa et al. |
| 8,455,611 B2 | 6/2013 | Motoyoshi et al. |
| 8,520,169 B2 | 8/2013 | Kitagawa et al. |
| 8,520,171 B2 | 8/2013 | Kitagawa et al. |
| 8,709,567 B2 | 4/2014 | Kitagawa et al. |
| 8,721,816 B2 | 5/2014 | Kitagawa et al. |
| 8,767,295 B2 | 7/2014 | Murakami et al. |
| 8,771,454 B2 | 7/2014 | Goto et al. |
| 8,778,486 B2 | 7/2014 | Tanaka et al. |
| 8,852,374 B2 | 10/2014 | Goto et al. |
| 2009/0086318 A1 | 4/2009 | Yaegashi et al. |
| 2009/0233102 A1 | 9/2009 | Toyama et al. |
| 2010/0045901 A1* | 2/2010 | Uehira ............... C07D 277/64 349/75 |
| 2011/0263787 A1* | 10/2011 | Takahashi ............ C09J 7/0217 524/556 |
| 2011/0263790 A1* | 10/2011 | Takahashi ............ C09J 7/045 524/832 |
| 2011/0288261 A1 | 11/2011 | Motoyoshi et al. |
| 2012/0055607 A1 | 3/2012 | Kitagawa et al. |
| 2012/0055608 A1 | 3/2012 | Kitagawa et al. |
| 2012/0055621 A1 | 3/2012 | Goto et al. |
| 2012/0055622 A1 | 3/2012 | Kitagawa et al. |
| 2012/0055623 A1 | 3/2012 | Kitagawa et al. |
| 2012/0056211 A1 | 3/2012 | Kitagawa et al. |
| 2012/0056340 A1 | 3/2012 | Kitagawa et al. |
| 2012/0057104 A1 | 3/2012 | Kitagawa et al. |
| 2012/0057107 A1 | 3/2012 | Kitagawa et al. |
| 2012/0057230 A1 | 3/2012 | Murakami et al. |
| 2012/0057231 A1 | 3/2012 | Goto et al. |
| 2012/0057232 A1 | 3/2012 | Goto et al. |
| 2012/0058291 A1 | 3/2012 | Kitagawa et al. |
| 2012/0058321 A1 | 3/2012 | Goto et al. |
| 2012/0308796 A1 | 12/2012 | Tanaka et al. |
| 2013/0005939 A1 | 1/2013 | Motoyoshi et al. |
| 2013/0100529 A1 | 4/2013 | Kitagawa et al. |
| 2013/0114139 A1 | 5/2013 | Kitagawa et al. |
| 2013/0249378 A1 | 9/2013 | Murakami et al. |
| 2014/0186568 A1 | 7/2014 | Kitagawa et al. |
| 2014/0268333 A1 | 9/2014 | Tanaka et al. |
| 2014/0268334 A1 | 9/2014 | Tanaka et al. |
| 2014/0285888 A1 | 9/2014 | Tanaka et al. |

FOREIGN PATENT DOCUMENTS

| | | |
|---|---|---|
| CN | 102712174 A | 10/2012 |
| EP | 2 543 509 A1 | 1/2013 |
| EP | 2543509 A1 | 1/2013 |
| JP | 5-27118 A | 2/1993 |
| JP | 2001-195003 A | 7/2001 |
| JP | 2003-279730 A | 10/2003 |
| JP | 2004-144943 A | 5/2004 |
| JP | 2006-171235 A | 6/2006 |
| JP | 2006-284703 A | 10/2006 |
| JP | 2007-108280 A | 4/2007 |
| JP | 2009-98623 A | 5/2009 |
| JP | 2010-134232 A | 6/2010 |
| JP | 2011-201303 A | 10/2011 |
| JP | 4804589 B1 | 11/2011 |
| JP | 2011-247967 A | 12/2011 |
| JP | 2012-31369 A | 2/2012 |
| TW | 201116563 A1 | 5/2011 |
| TW | 201125891 A1 | 8/2011 |
| WO | 00/26705 A1 | 5/2000 |
| WO | 2009/125717 A1 | 10/2009 |
| WO | 2011/108593 A1 | 9/2011 |
| WO | 2012/077663 A1 | 6/2012 |
| WO | 2013/039178 A1 | 3/2013 |

OTHER PUBLICATIONS

Office Action dated Jan. 15, 2015, issued in corresponding Taiwanese Patent Application No. 102123366, with English translation (11 pages).

Office Action dated Nov. 11, 2015, issued in counterpart Korean Application No. 519980608477, with English translation. (10 pages).

Office Action dated Nov. 11, 2015, issued in counterpart Korean Application No. 2014-7036566, with English translation. (10 pages).

Office Action dated Feb. 26, 2016, issued in counterpart Chinese Patent Application No. 201380034916.2, with English translation (24 pages).

\* cited by examiner

CIRCULAR POLARIZING PLATE AND ORGANIC ELECTROLUMINESCENCE PANEL

TECHNICAL FIELD

The present invention relates to a circularly polarizing plate and an organic EL panel.

BACKGROUND ART

In recent years, a display mounted with an organic EL panel has been proposed in association with wide spread use of a thin display. The organic EL panel is liable to cause problems such as ambient light reflection and background reflection because the panel includes a metal layer having high reflectivity. In view of the foregoing, it has been known that those problems are prevented by providing a circularly polarizing plate including a λ/4 plate on a viewer side. However, a circularly polarizing plate using an ordinary λ/4 plate involves a serious problem of decoloring. The use of a combination of a λ/4 plate and a λ/2 plate (Patent Literature 1), and the use of a λ/4 plate constituted of the so-called reverse wavelength dispersion material (Patent Literature 2) have each been proposed as means for solving such problem.

Here, when a circularly polarizing plate is used in an organic EL panel, the circularly polarizing plate is preferably as thin as possible in consideration of a demand for the thinning of the organic EL panel, and hence the use of a combination of a λ/4 plate and a λ/2 plate like the technology of Patent Literature 1 is required to be avoided to the extent possible. The use of only a λ/4 plate constituted of the reverse wavelength dispersion material like the technology of Patent Literature 2 can meet the demand for the thinning of the organic EL panel. However, the organic EL panel employing the technology of Patent Literature 2 involves a problem in that the warping of the panel itself occurs, and as a result, reflection unevenness occurs.

CITATION LIST

Patent Literature

[PTL 1] JP 5-27118 A
[PTL 2] JP 2006-171235 A

SUMMARY OF INVENTION

Technical Problem

The present invention has been made to solve the above-mentioned problems, and an object of the present invention is to provide a circularly polarizing plate that can prevent light leakage in an organic EL panel and can suppress the warping of the panel to reduce reflection unevenness in a panel surface.

Solution to Problem

The inventors of the present invention have made extensive studies on a relationship between a circularly polarizing plate and the warping of an organic EL panel. As a result, the inventors have found that when an adhesive strength between a polarizer and retardation film in the circularly polarizing plate is controlled to fall within a predetermined range, the durability of the plate as a laminated film is secured, and when the polarizer and the retardation film are directly bonded to each other, the object can be achieved. Thus, the inventors have completed the present invention.

A circularly polarizing plate according to an embodiment of the present invention is used in an organic EL panel, and includes a polarizer and a retardation film directly bonded to the polarizer. In-plane retardations of the retardation film satisfy a relationship of $Re(450)<Re(550)$; and a 90° adhesive strength between the polarizer and the retardation film is 1.0 N/20 mm or more. Here, $Re(450)$ and $Re(550)$ represent in-plane retardations measured at 23° C., and wavelengths of 450 nm and 550 nm, respectively.

In one embodiment of the present invention, the retardation film has been subjected to corona treatment or plasma treatment.

In one embodiment of the present invention, the circularly polarizing plate further includes an easy-adhesion layer between the polarizer and the retardation film.

In one embodiment of the present invention, the polarizer and the retardation film each have a long shape; and the retardation film satisfies a relationship of 35° 055° where 0 represents an angle formed between a lengthwise direction and slow axis of the retardation film.

In one embodiment of the present invention, the retardation film contains a resin having a repeating unit derived from an aliphatic monomer.

In one embodiment of the present invention, the retardation film contains at least one selected from the group consisting of a polycarbonate resin and a polyvinyl acetal resin.

In one embodiment of the present invention, the polycarbonate resin includes a structural unit derived from a dihydroxy compound having an etheric oxygen atom at at least one β-position or γ-position of a carbon atom bonded to a hydroxy group.

In one embodiment of the present invention, the etheric oxygen atom of the dihydroxy compound having the etheric oxygen atom includes an oxygen atom of a structure represented by the following formula (1).

$$-(CH_2-O)- \quad (1)$$

In one embodiment of the present invention, the dihydroxy compound having the etheric oxygen atom includes a dihydroxy compound represented by the following formula (2):

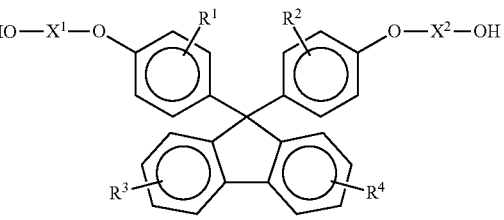

$$(2)$$

in the formula (2), $R^1$ to $R^4$ each independently represent a hydrogen atom, an alkyl group having 1 to 20 carbon atoms that may have a substituent, a cycloalkyl group having 6 to 20 carbon atoms that may have a substituent, or an aryl group having 6 to 20 carbon atoms that may have a substituent, and $X^1$ and $X^2$ each represent an alkylene group having 2 to 10 carbon atoms that may have a substituent, a cycloalkylene group having 6 to 20 carbon atoms that may have a substituent, or an arylene group having 6 to 20 carbon atoms that may have a substituent.

In one embodiment of the present invention, the dihydroxy compound having the etheric oxygen atom includes a dihydroxy compound represented by the following formula (3):

in the formula (3), $R^7$ represents a substituted or unsubstituted alkylene group having 2 to 10 carbon atoms, and p represents an integer of from 2 to 100.

In one embodiment of the present invention, the dihydroxy compound having the etheric oxygen atom has a cyclic ether structure.

In one embodiment of the present invention, the dihydroxy compound having the etheric oxygen atom has a plurality of cyclic structures.

In one embodiment of the present invention, the polycarbonate resin includes a structural unit derived from one or more kinds of dihydroxy compounds selected from the group consisting of a dihydroxy compound represented by the following formula (6) and a dihydroxy compound represented by the following formula (7):

in the formula (6), $R_5$ represents a substituted or unsubstituted cycloalkylene group of a monocyclic structure having 4 to 20 carbon atoms;

in the formula (7), $R_6$ represents a substituted or unsubstituted cycloalkylene group of a monocyclic structure having 4 to 20 carbon atoms.

In one embodiment of the present invention, the polycarbonate resin includes a structural unit derived from an aromatic dicarboxylic acid.

In one embodiment of the present invention, the polycarbonate resin includes a structural unit derived from an aromatic dihydroxy compound.

In one embodiment of the present invention, the aromatic dihydroxy compound comprises 2,2-bis(4-hydroxyphenyl) propane.

According to another aspect of the present invention, an organic EL panel is provided. The organic EL panel includes the circularly polarizing plate as described above.

Advantageous Effects of Invention

According to one embodiment of the present invention, when the 90° adhesive strength between the polarizer and the retardation film in the circularly polarizing plate to be used in an organic EL panel is set to 1.0 N/20 mm or more, excellent durability is obtained, the polarizer and the retardation film can be used in a state of being directly bonded to each other, and the plate can suppress the warping of the panel to reduce reflection unevenness in a panel surface.

DESCRIPTION OF EMBODIMENTS

Hereinafter, preferred embodiments of the present invention are described. However, the present invention is not limited to these embodiments.

Definitions of Terms and Symbols

Figure 1:
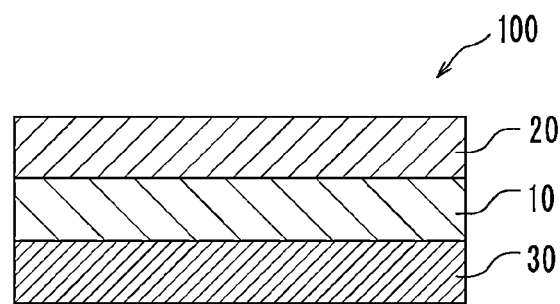
FIG. 1 is a schematic sectional view of a circularly polarizing plate according to a preferred embodiment of the present invention.

The definitions of terms and symbols used herein are as follows.
(1) Refractive Indices (nx, ny, and nz)
A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.
(2) In-Plane Retardation (Re)
The term "Re(550)" refers to the in-plane retardation of a film measured at 23° C. with light having a wavelength of 550 nm. The Re(550) is determined from the equation "Re=(nx−ny)×d" when the thickness of the film is represented by d (nm). It should be noted that the term "Re(450)" refers to the in-plane retardation of the film measured at 23° C. with light having a wavelength of 450 nm.
(3) Thickness Direction Retardation (Rth)
The term "Rth(550)" refers to the thickness direction retardation of the film measured at 23° C. with light having a wavelength of 550 nm. The Rth(550) is determined from the equation "Rth=(nx−nz)×d" when the thickness of the film is represented by d (nm). It should be noted that the term "Rth (450)" refers to the thickness direction retardation of the film measured at 23° C. with light having a wavelength of 450 nm.
(4) Nz Coefficient
An Nz coefficient is determined from the equation "Nz=Rth/Re".
A. Circularly Polarizing Plate
FIG. 1 is a schematic sectional view of a circularly polarizing plate according to a preferred embodiment of the present invention. A circularly polarizing plate 100 of this embodiment includes a polarizer 10, a protective film 20 arranged on one side of the polarizer 10, and a retardation film 30 arranged on the other side of the polarizer 10. In other words, in this embodiment, the polarizer 10 and the retardation film 30 are directly bonded to each other (that is, without through any protective film), and the retardation film 30 can also function as a protective film for the polarizer 10. When the polarizer and the retardation film are directly bonded to each other as described above, the warping of an organic EL panel in the case where the circularly polarizing plate is applied to the panel is suppressed, and as a result, reflection unevenness can be reduced. This is probably because although the polarizer has a large influence on a dimensional change, the dimensional change of the polarizer can be suppressed by directly bonding the polarizer and the retardation film to each other.

The retardation film shows the so-called reverse wavelength dispersion dependency. Specifically, its in-plane retardations satisfy a relationship of Re(450)<Re(550). When such relationship is satisfied, the plate is prevented from being decolored and can achieve an excellent reflection hue. In addition, an effect of adjusting an optical axis angle between the polarizer and the retardation film to be described later can be significantly obtained.

In the circularly polarizing plate 100, a 90° adhesive strength between the polarizer 10 and the retardation film 30 (hereinafter sometimes simply referred to as "adhesive strength") is 1.0 N/20 mm or more, preferably 1.1 N/20 mm or more, more preferably 1.5 N/20 mm or more. A practical upper limit for the adhesive strength is, for example, 10.0 N/20 mm. When the adhesive strength between the polarizer and the retardation film is controlled to fall within such range, the polarizer and the retardation film can be used in a state of being directly bonded to each other (without through any protective film). Accordingly, the warping of an organic EL panel in the case where the circularly polarizing plate is applied to the panel is suppressed, and as a result, reflection unevenness can be reduced. The finding was obtained only after the inventors had mounted the circularly polarizing plate on the organic EL panel, and had made trial and error. According to the present invention, the warping of the organic EL panel can be suppressed in an extremely satisfactory manner and the reflection unevenness can be significantly reduced by a synergistic effect of the optimization of the adhesive strength, and the direct bonding of the polarizer and the retardation film.

The refractive index characteristic of the retardation film 30 shows a relationship of nx>ny, and the retardation film 30 has a slow axis. The polarizer 10 and the retardation film 30 are laminated so that the absorption axis of the polarizer 10 and the slow axis of the retardation film 30 may form a predetermined angle. An angle θ formed between the absorption axis of the polarizer 10 and the slow axis of the retardation film 30 satisfies a relationship of preferably 35°≤θ≤55°, more preferably 38°≤θ≤52°, still more preferably 39°≤θ≤51°. It should be noted that when an angle is referred to in the description, the angle comprehends angles in both clockwise and counterclockwise directions unless otherwise stated.

In one embodiment, the circularly polarizing plate 100 has a long shape. Therefore, each of the polarizer 10 and the retardation film 30 also has a long shape. The circularly polarizing plate having a long shape can be stored and/or carried while, for example, being rolled in a roll shape. In this embodiment, the absorption axis of the polarizer typically corresponds to a lengthwise direction. Therefore, an angle θ formed between the slow axis and lengthwise direction of the retardation film 30 satisfies a relationship of preferably 35°≤θ≤55°, more preferably 38°≤θ≤52°, still more preferably 39°≤θ≤51°.

The total thickness of the circularly polarizing plate of the present invention is typically from about 40 μm to 300 μm, depending on its construction. Hereinafter, each layer constituting the circularly polarizing plate of the present invention is described.

A-1. Polarizer

Any appropriate polarizer may be adopted as the polarizer. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 μm to 80 μm.

A-2. Retardation film

As described above, the refractive index characteristic of the retardation film shows a relationship of nx>ny. The in-plane retardation Re(550) of the retardation film is preferably from 100 nm to 180 nm, more preferably from 135 nm to 155 nm.

As described above, the retardation film shows the so-called reverse wavelength dispersion dependency. Specifically, its in-plane retardations satisfy a relationship of Re(450)<Re(550). A ratio "Re(450)/Re(550)" is preferably 0.8 or more and less than 1.0.

The retardation film shows any appropriate refractive index ellipsoid as long as the film has the relationship of nx>ny. The refractive index ellipsoid of the retardation film preferably shows a relationship of nx>ny≥nz. The Nz coefficient of the retardation film is preferably from 1.05 to 2.0. The plate can be more satisfactorily prevented from being decolored by satisfying such relationships.

The retardation film is formed of any appropriate resin capable of realizing the adhesive strength between the retardation film and the polarizer as described above, and satisfying the optical characteristics. Examples of the resin forming the retardation film include a polycarbonate resin, a polyvinyl acetal resin, a cycloolefin-based resin, an acrylic resin, and a cellulose ester-based resin. Preferred examples of the resin include a polycarbonate resin and a polyvinyl acetal resin. One kind of the resin forming the retardation film may be used alone, or two or more kinds thereof may be used in combination depending on desired characteristics.

In a preferred embodiment, the polycarbonate resin can be produced by, for example, a melt polymerization method involving causing a dihydroxy compound and a carbonic acid diester to react with each other. Examples of the carbonic acid diester in this case include: a diaryl carbonate that may have a substituent such as diphenyl carbonate or ditolyl carbonate; and a dialkyl carbonate such as dimethyl carbonate, diethyl carbonate, or di-t-butyl carbonate. Of those, a diaryl carbonate that may have a substituent such as diphenyl carbonate or ditolyl carbonate is preferably used, and diphenyl carbonate is particularly preferably used. One kind of those carbonic acid diesters may be used alone, or two or more kinds thereof may be used as a mixture. It should be noted that the carbonic acid diester is preferably purified by distillation or the like as required before use because the diester may contain an impurity such as a chloride ion, and hence may inhibit a polymerization reaction or deteriorate the hue of the polycarbonate resin to be obtained.

Part of the carbonic acid diester may be substituted with a dicarboxylic acid or an ester thereof in an amount corresponding to 50 mol % or less, preferably 30 mol % or less of the diester. Terephthalic acid, isophthalic acid, diphenyl terephthalate, diphenyl isophthalate, or the like is used as such dicarboxylic acid or ester thereof. When part of the carbonic acid diester is substituted with a dicarboxylic acid or an ester thereof, the polycarbonate resin may be referred to as "polyester carbonate resin".

<Dihydroxy Compound>

As described above, the polycarbonate resin of this embodiment can be produced by, for example, the melt polymerization method involving causing the dihydroxy compound and the carbonic acid diester to react with each other. Although any compound can be used as the dihydroxy compound to be used as long as the compound can typically produce a polycarbonate resin, at least one kind of dihydroxy compound is preferably a dihydroxy compound having an etheric oxygen atom at at least one β- or γ-position of a carbon atom bonded to a hydroxy group. It should be noted that the "etheric oxygen atom" in the dihydroxy compound of this embodiment means that an oxygen atom is singly bonded to two carbon atoms, and is distinguished from an oxygen atom constituting a hydroxyl group or a carbonyl group. In addition, the β- or γ-position in the "dihydroxy compound having an etheric oxygen atom at at least one β- or γ-position of a carbon atom bonded to a hydroxy group" has the following meaning: with reference to the carbon atom bonded to the hydroxy group in the dihydroxy compound, the position of an adjacent carbon atom is defined as an α-position, the position of a carbon atom adjacent to the carbon atom at the α-position is defined as the β-position, and the position of a carbon atom adjacent to the carbon atom at the β-position is defined as the γ-position. In the case of, for example, isosorbide to be described later, a carbon atom corresponding to the β-position with reference to a carbon atom bonded to a hydroxy group is replaced with an etheric oxygen atom. Accordingly, isosorbide corresponds to an "aliphatic dihydroxy compound having an etheric oxygen atom at the β-position of a carbon atom bonded to a hydroxy group."

It is preferred that the etheric oxygen atom be part of a structure represented by the following formula (1), specifically be bonded to at least a methylene group.

(1)

The dihydroxy compound having an etheric oxygen atom is preferably a dihydroxy compound represented by the following formula (2).

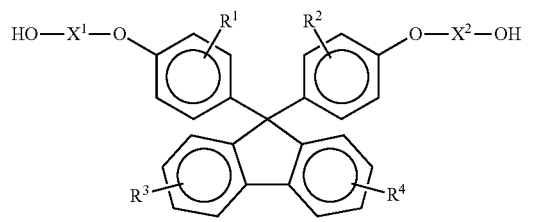

(2)

In the formula (2), $R^1$ to $R^4$ each independently represent a hydrogen atom, an alkyl group having 1 to 20 carbon atoms that may have a substituent, a cycloalkyl group having 6 to 20 carbon atoms that may have a substituent, or an aryl group having 6 to 20 carbon atoms that may have a substituent, and $R^1$ to $R^4$ may each independently be present in plurality for the corresponding ring, and $X^1$ and $X^2$ each represent an alkylene group having 2 to 10 carbon atoms that may have a substituent, a cycloalkylene group having 6 to 20 carbon atoms that may have a substituent, or an arylene group having 6 to 20 carbon atoms that may have a substituent.

In addition, the dihydroxy compound having an etheric oxygen atom is preferably a dihydroxy compound represented by the following formula (3).

(3)

(In the general formula (3), $R^7$ represents a substituted or unsubstituted alkylene group having 2 to 10 carbon atoms, and p represents an integer of from 2 to 100.)

Examples of the other dihydroxy compounds each having an etheric oxygen atom include compounds each having a cyclic ether structure. Of the compounds each having a cyclic ether structure, a compound having a plurality of etheric oxygen atoms is preferred and a compound having a plurality of cyclic structures is preferred. In addition, a compound having a plurality of cyclic ether structures is more preferred. More specific examples thereof include compounds having such cyclic ether structures as typified by the following formulae (4) and (5).

(4)

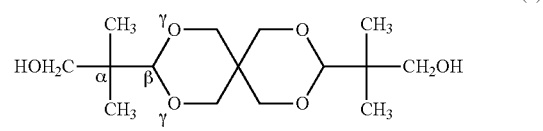

(5)

Examples of the dihydroxy compound represented by the formula (4) include isosorbide, isomannide, and isoidet in a stereoisomeric relationship. Of those dihydroxy compounds, isosorbide obtained by subjecting sorbitol produced from various kinds of starch abundantly present as resources and easily available to dehydration condensation is most preferred in terms of ease of availability, ease of production, optical characteristics, and formability.

<Dihydroxy Compound Represented by the Formula (2)>

More specific examples of the dihydroxy compound represented by the general formula (2) include compounds each having an etheric oxygen atom bonded to an aromatic group typified by the general formula (2) such as 9,9-bis(4-(2-hydroxyethoxy)phenyl)fluorene, 9,9-bis(4-(2-hydroxyethoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene.

<Dihydroxy Compound Represented by the Formula (3)>

Specific examples of the dihydroxy compound represented by the formula (3) include oxyalkylene glycols such as diethylene glycol, triethylene glycol, tetraethylene glycol, and polyethylene glycol (molecular weight: 150 to 2,000). Of those, diethylene glycol or polyethylene glycol is preferred.

One kind of the dihydroxy compounds each having an etheric oxygen atom may be used alone, or two or more kinds thereof may be used in combination depending on performance required for the polycarbonate resin to be obtained.

In one embodiment, the polycarbonate resin preferably contains a structural unit derived from the dihydroxy compound represented by the formula (2), a structural unit derived from the dihydroxy compound represented by the formula (3), and a structural unit derived from the dihydroxy compound represented by the formula (4).

<Dihydroxy Compound Other than Dihydroxy Compound Having Etheric Oxygen Atom>

When the polycarbonate resin of this embodiment is produced by the melt polymerization method involving causing the dihydroxy compound and the carbonic acid diester to react with each other, a dihydroxy compound other than the dihydroxy compound having an etheric oxygen atom is preferably used in combination in order to, for example, improve the toughness of a film to be produced from the resin to be obtained.

The dihydroxy compound other than the dihydroxy compound having an etheric oxygen atom is more specifically, for example, one or more kinds of dihydroxy compounds selected from the group consisting of a dihydroxy compound represented by the following formula (6) and a dihydroxy compound represented by the following formula (7).

HO—$R_5$—OH       (6)

(In the general formula (6), $R_5$ represents a substituted or unsubstituted cycloalkylene group of a monocyclic structure having 4 to 20 carbon atoms.)

HO—$CH_2$—$R_6$—$CH_2$—OH       (7)

(In the general formula (7), $R_6$ represents a substituted or unsubstituted cycloalkylene group of a monocyclic structure having 4 to 20 carbon atoms.)

<Dihydroxy Compound Represented by the General Formula (6)>

The dihydroxy compound represented by the general formula (6) is, for example, a compound including a cycloalkylene group of a monocyclic structure (alicyclic dihydroxy compound). Adopting the monocyclic structure can improve toughness when the polycarbonate resin to be obtained is shaped into a film. Typical examples of the alicyclic dihydroxy compound include compounds each including a five-membered ring structure or a six-membered ring structure. Adopting the five-membered ring structure or the six-membered ring structure can improve the heat resistance of the polycarbonate resin to be obtained. The six-membered ring structure may be fixed by a covalent bond in a chair form or a boat form. Specific examples thereof include 1,2-cyclopentanediol, 1,3-cyclopentanediol, 1,2-cyclohexanediol, 1,3-cyclohexanediol, 1,4-cyclohexanediol, and 2-methyl-1,4-cyclohexanediol. One kind of the dihydroxy compounds each represented by the general formula (6) may be used alone, or two or more kinds thereof may be used in combination.

<Dihydroxy Compound Represented by the General Formula (7)>

The dihydroxy compound represented by the general formula (7) is, for example, a compound including a cycloalkylene group of a monocyclic structure (alicyclic dihydroxy compound). Adopting the monocyclic structure can improve toughness when the polycarbonate resin to be obtained is shaped into a film. Typical examples of the alicyclic dihydroxy compound include various isomers in each of which $R_6$ in the general formula (7) is represented by the following general formula (Ia) (where $R_7$ represents a hydrogen atom, or a substituted or unsubstituted alkyl group having 1 to 12 carbon atoms). Preferred specific examples of such isomers include 1,2-cyclohexanedimethanol, 1,3-cyclohexanedimethanol, and 1,4-cyclohexanedimethanol. Those compounds are easily available and excellent in handling property. One kind of the dihydroxy compounds each represented by the general formula (7) may be used alone, or two or more kinds thereof may be used in combination.

(Ia)

It should be noted that the compounds exemplified in the foregoing with regard to the dihydroxy compounds represented by the general formulae (6) and (7) are each merely an example of the alicyclic dihydroxy compound that may be used, and the compounds used in the present invention are by no means limited thereto.

The polycarbonate resin of this embodiment may further contain a structural unit derived from any other dihydroxy compound. Examples of the other dihydroxy compound include fluorene-based dihydroxy compounds free of an etheric oxygen atom such as 9,9-bis(4-hydroxyphenyl)fluorene, 9,9-bis(4-hydroxy-3-methylphenyl)fluorene, 9,9-bis(4-hydroxy-3-ethylphenyl)fluorene, 9,9-bis(4-hydroxy-3-n-propylphenyl)fluorene, 9,9-bis(4-hydroxy-3-isopropylphenyl)fluorene, 9,9-bis(4-hydroxy-3-n-butylphenyl)fluorene, 9,9-bis(4-hydroxy-3-sec-butylphenyl)fluorene, 9,9-bis(4-hydroxy-3-tert-propylphenyl)fluorene, 9,9-bis(4-hydroxy-3-cyclohexylphenyl)fluorene, and 9,9-bis(4-hydroxy-3-phenylphenyl)fluorene, preferably 9,9-bis(4-hydroxy-3-methylphenyl)fluorene.

Further, another example of the other dihydroxy compound is a bisphenol. Examples of the bisphenol include 2,2-bis(4-hydroxyphenyl)propane [=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxydiphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl) sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, and 4,4'-dihydroxy-2,5-diethoxydiphenyl ether.

The content of the structural unit derived from the dihydroxy compound having an etheric oxygen atom in the polycarbonate resin is 18 mol % or more, preferably 20 mol % or more, more preferably 25 mol % or more. When the content of the structural unit is excessively small, reverse wavelength dispersion dependency may not be obtained.

The content of the structural units derived from one or more kinds of dihydroxy compounds selected from the group consisting of the dihydroxy compound represented by the general formula (3), the dihydroxy compound represented by the general formula (4), the dihydroxy compound represented by the general formula (5), and the dihydroxy compound represented by the general formula (6) in the polycarbonate resin is preferably 25 mol % or more, more preferably 30 mol % or more, still more preferably 35 mol % or more. When the content of the structural units is excessively small, toughness when the resin is shaped into a film may be poor.

The glass transition temperature of the polycarbonate resin is preferably 110° C. or more and 150° C. or less, more preferably 120° C. or more and 140° C. or less. When the glass transition temperature is excessively low, the heat resistance of the resin tends to deteriorate and hence the resin may cause a dimensional change after its forming into a film. In addition, the image quality of an organic EL panel to be obtained may reduce. When the glass transition temperature is excessively high, the forming stability of the resin at the time of its forming into a film may deteriorate. In addition, the transparency of the film may be impaired. It should be noted that the glass transition temperature is determined in conformity with JIS K 7121 (1987).

The molecular weight of the polycarbonate resin can be represented by a reduced viscosity. The reduced viscosity is measured as follows: a solution of the resin is prepared by using methylene chloride as a solvent while precisely adjusting a polycarbonate concentration to 0.6 g/dL, and the reduced viscosity of the solution is measured with an Ubbelohde viscosity tube at a temperature of 20.0° C.±0.1° C. In ordinary cases, a lower limit for the reduced viscosity is preferably 0.30 dL/g, more preferably 0.35 dL/g or more. In ordinary cases, an upper limit for the reduced viscosity is preferably 1.20 dL/g, more preferably 1.00 dL/g, still more preferably 0.80 dL/g. When the reduced viscosity is less than the lower limit, a problem in that the mechanical strength of a formed article reduces may arise. On the other hand, when the reduced viscosity is more than the upper limit, a problem in that the flowability of the resin upon its forming reduces, and hence productivity or formability reduces may arise.

<Polyvinyl Acetal Resin>

Any appropriate polyvinyl acetal resin may be used as the polyvinyl acetal resin. The polyvinyl acetal resin can be typically obtained by subjecting at least two kinds of aldehyde compounds and/or ketone compounds, and a polyvinyl alcohol-based resin to a condensation reaction.

Examples of the aldehyde compound include formaldehyde, acetaldehyde, 1,1-diethoxyethane (acetal), propionaldehyde, n-butyraldehyde, isobutyraldehyde, cyclohexanecarboxaldehyde, 5-norbornene-2-carboxaldehyde, 3-cyclohexene-1-carboxaldehyde, dimethyl-3-cyclohexene-1-carboxaldehyde, benzaldehyde, 2-chlorobenzaldehyde, p-dimethylaminobenzaldehyde, t-butylbenzaldehyde, 3,4-dimethoxybenzaldehyde, 2-nitrobenzaldehyde, 4-cyanobenzaldehyde, 4-carboxybenzaldehyde, 4-phenylbenzaldehyde, 4-fluorobenzaldehyde, 2-(trifluoromethyl)benzaldehyde, 1-naphthaldehyde, 2-naphthaldehyde, 2-methoxy-1-naphthaldehyde, 2-ethoxy-1-naphthaldehyde, 2-propoxy-1-naphthaldehyde, 2-methyl-1-naphthaldehyde, 2-hydroxy-1-naphthaldehyde, 6-methoxy-2-naphthaldehyde, 3-methyl-2-thiophenecarboxaldehyde, 2-pyridinecarboxaldehyde, and indole-3-carboxaldehyde.

Examples of the ketone compound include acetone, ethyl methyl ketone, diethyl ketone, t-butyl ketone, dipropyl ketone, allyl ethyl ketone, acetophenone, p-methylacetophenone, 4'-aminoacetophenone, p-chloroacetophenone, 4'-methoxyacetophenone, 2'-hydroxyacetophenone, 3'-nitroacetophenone, P-(1-piperidino)acetophenone, benzalacetophenone, propiophenone, benzophenone, 4-nitrobenzophenone, 2-methylbenzophenone, p-bromobenzophenone, cyclohexyl(phenyl)methanone, 2-butyronaphthone, 1-acetonaphthone, 2-hydroxy-1-acetonaphthone, and 8'-hydroxy-1'-benzonaphthone.

One kind of each of the aldehyde compounds and the ketone compounds may be used alone, or two or more kinds thereof may be used in combination. When two or more kinds of aldehyde compounds and/or ketone compounds are used in combination, the kinds, number, numbers of moles, and the like of the compounds to be used may be appropriately set depending on purposes.

Any appropriate polyvinyl alcohol-based resin may be adopted as the polyvinyl alcohol-based resin depending on purposes. The polyvinyl alcohol-based resin may be a linear polymer or may be a branched polymer. In addition, the polyvinyl alcohol-based resin may be a homopolymer, or may be a copolymer polymerized from two or more kinds of unit monomers. When the polyvinyl alcohol-based resin is a copolymer, the sequence of its basic units may be any one of the alternate, random, and block sequences. The copolymer is typically, for example, an ethylene-vinyl alcohol copolymer. The polyvinyl alcohol-based resin can be obtained by, for example, polymerizing a vinyl ester-based monomer to provide a vinyl ester-based polymer and saponifying the polymer to turn a vinyl ester unit into a vinyl alcohol unit. Examples of the vinyl ester-based monomer include vinyl formate, vinyl acetate, vinyl propionate, vinyl valerate, vinyl laurate, vinyl stearate, vinyl benzoate, vinyl pivalate, and vinyl versatate. Of those vinyl ester-based monomers, vinyl acetate is particularly preferred.

The glass transition temperature of the polyvinyl acetal resin is preferably from 90° C. to 190° C., more preferably from 100° C. to 170° C., particularly preferably from 110° C. to 150° C.

More specific examples of, and a detailed production method for, the polyvinyl acetal resin are described in, for example, JP 2007-161994A. The description is incorporated herein by reference.

The retardation film is typically produced by stretching a resin film in at least one direction.

Any appropriate method may be adopted as a method of forming the resin film. Examples thereof include a melt extrusion method (such as a T die forming method), a cast coating method (such as a casting method), a calender forming method, a hot press method, a co-extrusion method, a co-melting method, multilayer extrusion, and an inflation forming method. Of those, a T die forming method, a casting method, and an inflation molding method are preferably used.

The thickness of the resin film (unstretched film) may be set to any appropriate value depending on, for example, desired optical characteristics and stretching conditions to be described later. The thickness is preferably from 50 μm to 300 μm, more preferably from 80 μm to 250 μm.

Any appropriate stretching method and stretching conditions (such as a stretching temperature, a stretching ratio, and a stretching direction) may be adopted for the stretching. Specifically, one kind of various stretching methods such as free-end stretching, fixed-end stretching, free-end shrinkage, and fixed-end shrinkage may be employed alone, or two or more kinds thereof may be employed simultaneously or sequentially. With regard to the stretching direction, the stretching may be performed in various directions or dimensions such as a horizontal direction, a vertical direction, a thickness direction, and a diagonal direction. When the glass transition temperature of the resin film is represented by Tg, the stretching temperature ranges preferably from Tg−20° C. to Tg+20° C.

A retardation film having the desired optical characteristics (such as a refractive index ellipsoid, an in-plane retardation, and an Nz coefficient) can be obtained by appropriately selecting the stretching method and stretching conditions.

In one embodiment, the retardation film is produced by subjecting the resin film to uniaxial stretching or fixed-end uniaxial stretching. The fixed-end uniaxial stretching is, for example, a method involving stretching the resin film in its lengthwise direction (longitudinal direction) while running the film in its lengthwise direction. The stretching ratio is preferably from 100% to 500%.

In another embodiment, the retardation film is produced by obliquely stretching a resin film having a long shape in a direction at the angle θ with respect to its lengthwise direction in a continuous manner. Adopting the oblique stretching provides a stretched film having a long shape with an alignment angle of the angle θ with respect to the lengthwise direction of the film, enables a roll-to-roll process upon, for example, its lamination with the polarizer, and can simplify a production process.

A stretching machine to be used in the oblique stretching is, for example, a tenter-type stretching machine capable of applying a feeding force or tensile force, or take-up force having different speeds on left and right sides in a lateral direction and/or a longitudinal direction. Although the tenter-type stretching machine comes in, for example, a lateral uniaxial stretching machine and a simultaneous biaxial stretching machine, any appropriate stretching machine may be used as long as the machine can obliquely stretch the resin film having a long shape in a continuous manner.

As a method for the oblique stretching, there is given, for example, a method disclosed in JP 50-83482 A, JP 2-113920 A, JP 3-182701 A, JP 2000-9912 A, JP 2002-86554 A, or JP 2002-22944 A.

The thickness of the retardation film (stretched film) is preferably from 20 μm to 100 μm, more preferably from 30 μm to 80 μm.

The surface on the polarizer 10 side of the retardation film 30 has preferably been subjected to surface treatment. Examples of the surface treatment include corona treatment, plasma treatment, flame treatment, primer application treatment, and saponification treatment. The corona treatment is, for example, a system involving performing discharge with a corona treatment machine in normal-pressure air. The plasma treatment is, for example, a system involving performing discharge with a plasma discharger in normal-pressure air. The flame treatment is, for example, a system involving bringing a flame into direct contact with the film surface. The primer application treatment is, for example, a system involving diluting an isocyanate compound, a silane coupling agent, and the like with a solvent, and thinly applying the diluted solution. The saponification treatment is, for example, a system involving immersing the film in an aqueous solution of sodium hydroxide. Of those, corona treatment or plasma treatment is preferred. This is because any such treatment can hydrophilize the surface of even a material having no hydrolyzability and hence enables the surface modification of various materials.

A-3. Protective Film

The protective film 20 is formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin such as a (meth)acrylic resin, a urethane-based resin, a (meth)acrylic urethane-based resin, an epoxy-based resin, or a silicone-based resin. Still another example thereof is a glassy polymer such as a siloxane-based polymer. Further, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, and is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl(meth)acrylate-styrene copolymer (such as an MS resin), and a polymer having an alicyclic hydrocarbon group (such as a methyl metharylate-cyclohexyl methacrylate copolymer or a methyl methacrylate-norbornyl(meth)acrylate copolymer). Preferred examples thereof include poly ($C_{1-6}$ alkyl(meth)acrylates) such as polymethyl(meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth)acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, and is preferably 170° C. or less from the viewpoint of formability or the like.

It should be noted that the term "(meth)acrylic" as used herein refers to acrylic and/or methacrylic.

The surface on the side of the protective film 20 opposite to the polarizer may be subjected to surface treatment such as hard coat treatment, antireflection treatment, antisticking treatment, or antiglare treatment as required. The thickness of the protective film is typically 5 mm or less, preferably 1 mm or less, more preferably from 1 µm to 500 µm, still more preferably from 5 µm to 150 µm.

A-4. Easy-Adhesion Layer

In one embodiment, an easy-adhesion layer (not shown) may be formed between the polarizer 10 and the retardation film 30. When the easy-adhesion layer is formed, the retardation film may be or may not be subjected to the surface treatment. The retardation film has preferably been subjected to the surface treatment. The combination of the easy-adhesion layer and the surface treatment can promote the realization of a desired adhesive strength between the polarizer 10 and the retardation film 30. The easy-adhesion layer preferably contains a silane having a reactive functional group. The formation of such easy-adhesion layer can promote the realization of a desired adhesive strength between the polarizer 10 and the retardation film 30.

Specific examples of the silane having a reactive functional group include: isocyanate group-containing alkoxysilanes such as γ-isocyanatepropyltrimethoxysilane, γ-isocyanatepropyltriethoxysilane, γ-isocyanatepropylmethyldiethoxysilane, and γ-isocyanatepropylmethyldimethoxysilane; amino group-containing alkoxysilanes such as γ-aminopropyltrimethoxysilane, γ-aminopropyltriethoxysilane, γ-aminopropylmethyldimethoxysilane, γ-aminopropylmethyldiethoxysilane, γ-(2-aminoethyl)aminopropyltrimethoxysilane, γ-(2-aminoethyl)aminopropylmethyldimethoxysilane, γ-(2-aminoethyl)aminopropyltriethoxysilane, γ-(2-aminoethyl)aminopropylmethyldiethoxysilane, γ-ureidopropyltrimethoxysilane, N-phenyl-γ-aminopropyltrimethoxysilane, N-benzyl-γ-aminopropyltrimethoxysilane, and N-vinylbenzyl-γ-aminopropyltriethoxysilane; mercapto group-containing alkoxysilanes such as γ-mercaptopropyltrimethoxysilane, γ-mercaptopropyltriethoxysilane, γ-mercaptopropylmethyldimethoxysilane, and γ-mercaptopropylmethyldiethoxysilane; epoxy group-containing alkoxysilanes such as γ-glycidoxypropyltrimethoxysilane, γ-glycidoxypropyltriethoxysilane, γ-glycidoxypropylmethyldimethoxysilane, β-(3,4-epoxycyclohexyl)ethyltrimethoxysilane, and β-(3,4-epoxycyclohexyl)ethyltriethoxysilane; carboxy-containing alkoxysilanes such as β-carboxyethyltriethoxysilane, β-carboxyethylphenylbis(2-methoxyethoxy)silane, and N-β-(carboxymethyl)aminoethyl-γ-aminopropyltrimethoxysilane; vinyl unsaturated group-containing alkoxysilanes such as vinyltrimethoxysilane, vinyltriethoxysilane, γ-methacryloyloxypropylmethyldimethoxysilane, and γ-acryloyloxypropylmethyltriethoxysilane; halogen group-containing alkoxysilanes such as γ-chloropropyltrimethoxysilane; isocyanurate group-containing alkoxysilanes such as tris(trimethoxysilyl)isocyanurate; and an amino-modified silyl polymer, a silylated amino polymer, an unsaturated aminosilane complex, a phenylamino long chain alkylsilane, aminosilylated silicone, silylated polyester, and derivatives thereof. One kind of those silanes may be used alone, or two or more kinds thereof may be used in combination.

The silane may be appropriately selected in accordance with the kind of retardation film, the kind of adhesive to be used for bonding the retardation film and the polarizer, and the like. For example, in the case where a water-based adhesive containing PVA is used as the adhesive, preferred examples of the silane include amino group-containing alkoxysilanes such as γ-aminopropyltrimethoxysilane, γ-aminopropyltriethoxysilane, γ-aminopropylmethyldimethoxysilane, γ-aminopropylmethyldiethoxysilane, γ-(2-aminoethyl)aminopropyltrimethoxysilane, γ-(2-aminoethyl)aminopropylmethyldimethoxysilane, γ-(2-aminoethyl)aminopropyltriethoxysilane, γ-(2-aminoethyl)aminopropylmethyldiethoxysilane, γ-ureidopropyltrimethoxysilane, N-phenyl-γ-aminopropyltrimethoxysilane, N-benzyl-γ-aminopropyltrimethoxysilane, and N-vinylbenzyl-γ-aminopropyltriethoxysilane. This is because an easy-adhesion layer having favorable light transmittance, wettability, and adhesive strength is easily formed. Of those, γ-(2-aminoethyl)aminopropyltriethoxysilane and γ-(2-aminoethyl)aminopropylmethyldiethoxysilane are preferred because an easy-adhesion layer having particularly excellent adhesive strength is easily formed.

The thickness of the easy-adhesion layer is from 1 nm to 100 nm, preferably from 1 nm to 50 nm, more preferably from 10 nm to 50 nm. The thickness of the easy-adhesion layer is adjusted to 100 nm or less. Thus, even in the case where the circularly polarizing plate to be obtained is used under high temperature and high humidity conditions, decoloring, floating, unevenness, and streaks are not caused. That is, a circularly polarizing plate having excellent appearance maintaining ability and excellent optical characteristic maintaining ability under high temperature and high humidity conditions may be obtained.

A-5. Others

Any appropriate pressure-sensitive adhesive layer or adhesive layer is used in the lamination of the respective layers constituting the circularly polarizing plate of the present invention. The pressure-sensitive adhesive layer is typically formed of an acrylic pressure-sensitive adhesive. The adhesive layer is typically formed of a polyvinyl alcohol-based adhesive.

The pressure-sensitive adhesive layer may be formed on the retardation film 30 side of the circularly polarizing plate 100, though the layer is not shown. When the pressure-sensitive adhesive layer is formed in advance, the plate can be easily bonded to any other optical member (such as an organic EL panel). It should be noted that a release film is preferably attached to the surface of the pressure-sensitive adhesive layer until the layer is used.

B. Organic EL Panel

An organic EL panel of the present invention includes the above-described circularly polarizing plate on its viewer side. The circularly polarizing plate is laminated so that its retardation film may be on the organic EL panel side (its polarizer may be on the viewer side).

EXAMPLES

Hereinafter, the present invention is specifically described by way of Examples. However, the present invention is not limited by Examples. Methods of measuring characteristics are as described below. It should be noted that "part(s)" and "%" in Examples and Comparative Examples refer to "part(s) by weight" and "wt %", respectively unless otherwise stated.

(1) Thickness

Measurement was performed with a dial gauge (manufactured by PEACOCK, product name: "DG-205 type pds-2").

(2) Retardation

Measurement was performed by using Axoscan manufactured by Axometrics. Measurement wavelengths were 450 nm and 550 nm, and a measurement temperature was 23° C.

It should be noted that a film piece measuring 50 mm by 50 mm was cut out of a retardation film and used as a measurement sample.

(3) Alignment Angle

A measurement sample was placed on the measuring table of Axoscan manufactured by Axometrics in a parallel manner, and the alignment angle of a retardation film was measured. It should be noted that a film piece measuring 50 mm by 50 mm was cut out of the retardation film and used as the measurement sample.

(4) 90° Adhesive Strength

A piece having the following dimensions was cut out of a circularly polarizing plate obtained in each of Examples and Comparative Examples: the piece measured 200 mm in a direction parallel to the absorption axis direction of the polarizer of the plate and 20 mm in a direction perpendicular thereto. A notch was made into a space between the retardation film and the polarizer with a box cutter, and the circularly polarizing plate was bonded to a glass plate. The retardation film and the polarizer were peeled with a Tensilon universal tester RTC manufactured by A&D Company, Limited in a 90° direction at a peel rate of 500 mm/min, and a peel strength at this time was measured and defined as a 90° adhesive strength.

(5) Hot Water Immersion Test

A 50-mm square piece was cut out of the circularly polarizing plate obtained in each of Examples and Comparative Examples, the piece was immersed in hot water at 60° C. for 6 hours, and the residual ratio of the area of the polarizer where its transmittance was 50% or less was measured. It should be noted that an evaluation was performed in conformity with the following criteria.

○: 90% or more
Δ: From 50 to 90%
x: Less than 50%

(6) Production of Organic EL Panel

An organic EL panel was taken out of an organic EL display (manufactured by LG, product name: "15EL9500", measuring 235 mm by 351 mm), a polarizing plate attached to the organic EL panel was peeled, and the circularly polarizing plate obtained in each of Examples and Comparative Examples was bonded instead to the remainder through an acrylic pressure-sensitive adhesive to provide an organic EL panel.

(7) Warping Test

The organic EL panel obtained in the section (6) was heated in a high-temperature oven at 70° C. for 120 hours. After that, the warping amounts of the four corners of the panel were measured and their average was defined as a warping amount (mm). Further, the reflection unevenness of the organic EL panel after the heating was visually observed. It should be noted that evaluation criteria are as described below.

○: No unevenness
Δ: An unevenness area is 30% or less.
x: An unevenness area exceeds 30%.

Example 1

Production of Polycarbonate Resin Film 26.2 Parts by mass of isosorbide (ISB), 100.5 parts by mass of 9,9-[4-(2-hydroxyethoxy)phenyl]fluorene (BHEPF), 10.7 parts by mass of 1,4-cyclohexanedimethanol (1,4-CHDM), 105.1 parts by mass of diphenyl carbonate (DPC), and 0.591 part by mass of cesium carbonate (0.2 mass % aqueous solution) as a catalyst were loaded into a reaction vessel. Under a nitrogen atmosphere, as the first step of a reaction, the heating medium temperature of the reaction vessel was set to 150° C., and the raw materials were dissolved (for about 15 minutes) while being stirred as required.

Next, a pressure in the reaction vessel was increased from normal pressure to 13.3 kPa, and produced phenol was extracted to the outside of the reaction vessel while the heating medium temperature of the reaction vessel was increased to 190° C. in 1 hour.

A temperature in the reaction vessel was held at 190° C. for 15 minutes. After that, as a second step, the pressure in the reaction vessel was set to 6.67 kPa, the heating medium temperature of the reaction vessel was increased to 230° C. in 15 minutes, and the produced phenol was extracted to the outside of the reaction vessel. The temperature was increased to 250° C. in 8 minutes because the stirring torque of a stirring machine increased. In order for the produced phenol to be further removed, the pressure in the reaction vessel was reduced to 0.200 kPa or less. After the stirring torque had reached a predetermined value, the reaction was completed, and a produced reaction product was extruded into water and then pelletized. Thus, a polycarbonate resin A having a ratio "BHEPF/ISB/1,4-CHDM" of 47.4 mol %/37.1 mol %/15.5 mol % was obtained.

The resultant polycarbonate resin A had a glass transition temperature of 136.6° C. and a reduced viscosity of 0.395 dL/g.

The resultant polycarbonate resin A was dried in a vacuum at 80° C. for 5 hours. After that, a polycarbonate resin film having a thickness of 100 μm was produced by using a film-producing apparatus including a uniaxial extruder (manufactured by Isuzu Kakoki, screw diameter: 25 mm, cylinder preset temperature: 220° C.), a T-die (width: 200 mm, preset temperature: 220° C.), a chill roll (preset temperature: 120 to 130° C.), and a rolling machine.

(Production of Retardation Film)

A sample measuring 350 mm wide by 700 mm long was cut out of the polycarbonate resin film obtained in the foregoing. The sample was uniaxially stretched with a batch-type biaxial stretching apparatus KARO IV (manufactured by Bruckner) at a stretching temperature higher than its glass transition temperature by 4° C., a stretching rate of 180 mm/min (a strain rate of 300%/min), and a stretching ratio of 1×2.0 times to provide a transparent film. At this time, the stretching was performed while the sample was not held in a direction perpendicular to the stretching direction. Thus, a retardation film having a thickness of 70 μm was obtained. The resultant retardation film had an Re(550) of 141 nm, a ratio "Re(450)/Re(550)" of 0.89, an Nz coefficient of 1.05, and an alignment angle of 0° with respect to its lengthwise direction (stretching direction).

(Production of Circularly Polarizing Plate)

One surface of the retardation film obtained in the foregoing was subjected to corona treatment. Meanwhile, 67 parts of isopropyl alcohol were mixed in 100 parts of a silane compound represented by a chemical formula "$NH_2CH_2NHCH_2CH_2Si(OC_2H_5)_3$" (manufactured by NUC Corporation, trade name: APZ6601) to prepare a 60% silane compound solution. The silane compound solution was applied onto the corona-treated surface of the retardation film and dried at 120° C. for 2 minutes to form an easy-adhesion layer having a thickness of 40 nm on the retardation film.

Figure 2:
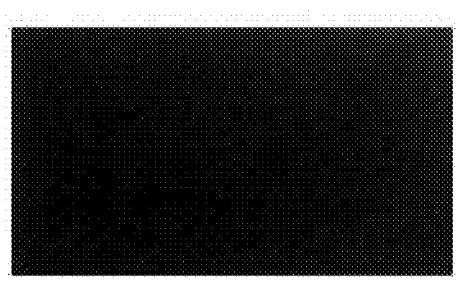
FIG. 2 is an image showing the result of the observation of the reflection unevenness of an organic EL panel of Example 1.

Next, the retardation film having formed thereon the easy-adhesion layer was bonded to one surface of a polarizer used in a commercial polarizing plate (manufactured by Nitto Denko Corporation, product name: "CVS1775SDUHC") through a PVA-based adhesive so that the easy-adhesion layer was on the polarizer side. At that time, the bonding was performed so that the slow axis of the retardation film and the absorption axis of the polarizer formed an angle of 45°. A TAC film subjected to saponification treatment (manufactured by FUJIFILM Corporation, trade name: FUJITAC UV80) was bonded to the other surface of the polarizer through a PVA-based adhesive. The laminate was dried at 70° C. for 10 minutes, and a piece measuring 330 mm by 250 mm was cut out of the laminate to provide a circularly polarizing plate. An adhesive strength between the polarizer and retardation film in the resultant circularly polarizing plate was 1.2 N/20 mm. The resultant circularly polarizing plate showed a good result in the hot water immersion test. Further, an organic EL panel was produced by using the resultant circularly polarizing plate according to the procedure of the section (6), and the resultant organic EL panel was subjected to the warping test of the section (7). Table 1 shows the results. Further, FIG. 2 shows the result of the observation of the reflection unevenness of the organic EL panel.

Example 2

Production of Polyvinyl Acetal Resin Film 8.8 Grams of a polyvinyl alcohol-based resin (manufactured by The Nippon Synthetic Chemical Industry Co., Ltd., trade name: "NH-18" (polymerization degree=1,800, saponification degree=99.0%)) were dried at 105° C. for 2 hours, and were then dissolved in 167.2 g of dimethyl sulfoxide (DMSO). 2.98 Grams of 2-methoxy-1-naphthaldehyde and 0.80 g of p-toluenesulfonic acid monohydrate were added to the solution, and the mixture was stirred at 40° C. for 1 hour. 23.64 Grams of 1,1-diethoxyethane (acetal) were further added to the reaction solution, and the mixture was stirred at 40° C. for 4 hours. After that, 2.13 g of triethylamine were added to the mixture to terminate the reaction. The resultant crude product was reprecipitated with 1 L of methanol. A polymer that had been filtered out was dissolved in tetrahydrofuran and reprecipitated with methanol again. The resultant was filtered out and dried to provide 12.7 g of a white polymer. $^1$H-NMR measurement showed that the polymer had a repeating unit represented by the following formula (X) and a ratio (molar ratio) "l:m:n" was 12:60:28. In addition, the glass transition temperature of the polymer measured with a differential scanning calorimeter was 127° C.

$^1$H-NMR (DMSO): 0.8-2.3 (main-chain methylene and the methyl of an acetal moiety), 3.4-4.4 (main-chain methine having bonded thereto an oxygen atom, the methyl of a methoxy group, and a hydroxyl group), 4.5-5.1 (the methine of an acetal moiety), 6.4 (the methine of a 2-methoxynaphthalene moiety), 7.3-8.8 (the aromatic protons of the 2-methoxynaphthalene moiety)

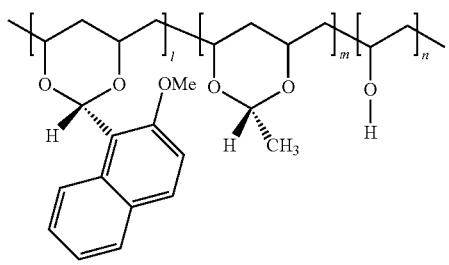

(X)

The polymer was dissolved in methyl ethyl ketone (MEK), and the solution was applied onto a polyethylene terephthalate film having a thickness of 70 µm (manufactured by Toray Industries, Inc., trade name: "LUMIRROR S-27E") with an applicator and dried in an air circulation-type drying oven. After that, an optical film having having a thickness of 70 µm was produced by peeling the dried product from the polyethylene terephthalate film. The optical film was stretched with a stretching machine in an air circulation-type drying oven at 140° C. at a stretching ratio of 1.5 times to provide a retardation film. The resultant retardation film had an Re(550) of 145 nm, a ratio "Re(450)/Re(550)" of 0.93, and an alignment angle of 0° with respect to its lengthwise direction (stretching direction).

(Production of Circularly Polarizing Plate and Organic EL Panel)

A circularly polarizing plate and an organic EL panel were produced in the same manner as in Example 1 except that the retardation film obtained in the foregoing was used. An adhesive strength between the polarizer and the retardation film in the resultant circularly polarizing plate was 1.1 N/20 mm. The resultant circularly polarizing plate was subjected to the hot water immersion test, and the organic EL panel using the resultant circularly polarizing plate was subjected to the warping test. Table 1 shows the results.

Comparative Example 1-1

A circularly polarizing plate was produced in the same manner as in Example 1 except that no easy-adhesion layer was formed on the retardation film. An adhesive strength between the polarizer and the retardation film in the resultant circularly polarizing plate was 0.6 N/20 mm. The resultant circularly polarizing plate could not be subjected to the warping test of an organic EL panel because its polarizer and retardation film peeled from each other in the hot water immersion test. Table 1 shows the results.

Comparative Example 1-2

Figure 3:
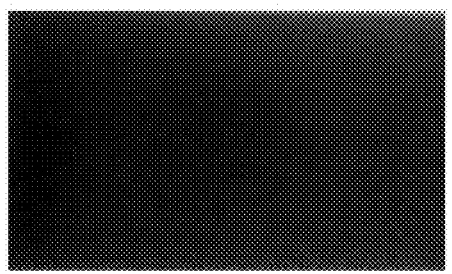
FIG. 3 is an image showing the result of the observation of the reflection unevenness of an organic EL panel of Comparative Example 1-2.

A commercial polarizing plate having a construction "protective film with a surface-treated layer/polarizer/inner protective film" (manufactured by Nitto Denko Corporation, product name: "CVS1775SDUHC") was used, and a circularly polarizing plate was produced by bonding the inner protective film and the retardation film of Comparative Example 1-1 through an acrylic pressure-sensitive adhesive. An organic EL panel was produced by using the resultant circularly polarizing plate and was subjected to the warping test. Table 1 shows the result. Further, FIG. 3 shows the result of the observation of the reflection unevenness of the organic EL panel.

Comparative Example 2-1

A circularly polarizing plate was produced in the same manner as in Comparative Example 1-1 except that the retardation film was not subjected to the corona treatment. An adhesive strength between the polarizer and the retardation film in the resultant circularly polarizing plate was 0.2 N/20 mm. The resultant circularly polarizing plate could not be subjected to the warping test of an organic EL panel because its polarizer and retardation film peeled from each other in the hot water immersion test. Table 1 shows the results.

Comparative Example 2-2

A circularly polarizing plate was produced in the same manner as in Comparative Example 1-2 except that the retardation film of Comparative Example 1-1 was used. An organic EL panel was produced by using the resultant circularly polarizing plate and was subjected to the warping test. Table 1 shows the result.

TABLE 1

|  | Adhesive strength (N/20 mm) | Hot water test | Warping amount (mm) | Reflection unevenness |
|---|---|---|---|---|
| Example 1 | 1.2 | ○ | 6.9 | ○ |
| Example 2 | 1.1 | ○ | 7.4 | ○ |
| Comparative Example 1-1 | 0.6 | x | Unmeasurable | Unmeasurable |
| Comparative Example 1-2 | With protective film | — | 10.5 | x |
| Comparative Example 2-1 | 0.2 | x | Unmeasurable | Unmeasurable |
| Comparative Example 2-2 | With protective film | — | 10.0 | x |

[Evaluation]

As is apparent from Table 1, according to each of Examples of the present invention, when the 90° adhesive strength between the polarizer and the retardation film is set to a predetermined value or more, excellent durability is obtained in the hot water immersion test, the polarizer and the retardation film can be used in a state of being directly bonded to each other, and the plate can suppress the warping of the panel to reduce the reflection unevenness in the panel surface. On the other hand, as is apparent from each of Comparative Examples 1-1 and 2-1, when the 90° adhesive strength between the polarizer and the retardation film is small, practically acceptable durability is not obtained in the organic EL panel. Further, as is apparent from each of Comparative Examples 1-2 and 2-2, when the polarizer and the retardation film cannot be used in a state of being directly bonded to each other, the warping amount of the panel increases and hence the reflection unevenness increases. As shown in FIGS. 2 and 3, the organic EL panel of Example 1 is found to be significantly suppressed in reflection unevenness as compared with the organic EL panel of Comparative Example 1-2.

INDUSTRIAL APPLICABILITY

The circularly polarizing plate of the present invention is suitably used in an organic EL device.

REFERENCE SIGNS LIST 10 polarizer
20 protective film
30 retardation film
100 circularly polarizing plate

The invention claimed is:

1. A circularly polarizing plate for an organic EL panel, comprising:
   a polarizer; and
   a retardation film directly bonded to the polarizer, wherein:
   in-plane retardations of the retardation film satisfy a relationship of Re(450)<Re(550); and
   a 90° adhesive strength between the polarizer and the retardation film is 1.0 N/20 mm or more;
   where Re(450) and Re(550) represent in-plane retardations measured at 23° C., and wavelengths of 450 nm and 550 nm, respectively.

2. The circularly polarizing plate according to claim 1, wherein the retardation film has been subjected to corona treatment or plasma treatment.

3. The circularly polarizing plate according to claim 2, further comprising an easy-adhesion layer between the polarizer and the retardation film.

4. The circularly polarizing plate according to claim 1, wherein:
   the polarizer and the retardation film each have a long shape; and
   the retardation film satisfies a relationship of 35°≤θ≤55° where θ represents an angle formed between a lengthwise direction and a slow axis of the retardation film.

5. The circularly polarizing plate according to claim 1, wherein the retardation film contains a resin having a repeating unit derived from an aliphatic monomer.

6. The circularly polarizing plate according to claim 1, wherein the retardation film contains at least one selected from the group consisting of a polycarbonate resin and a polyvinyl acetal resin.

7. The circularly polarizing plate according to claim 6, wherein the polycarbonate resin includes a structural unit derived from a dihydroxy compound having an etheric oxygen atom at at least one β-position or γ-position of a carbon atom bonded to a hydroxy group.

8. The circularly polarizing plate according to claim 7, wherein the etheric oxygen atom of the dihydroxy compound having the etheric oxygen atom comprises an oxygen atom of a structure represented by the following formula (1):

(1)

9. The circularly polarizing plate according to claim 7, wherein the dihydroxy compound having the etheric oxygen atom comprises a dihydroxy compound represented by the following formula (2):

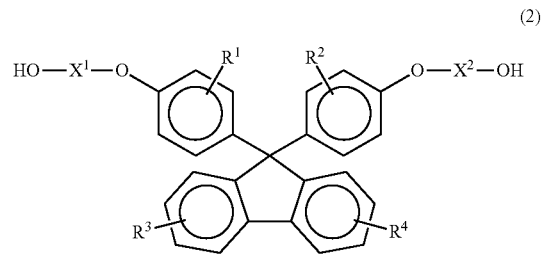

(2)

in the formula (2), $R^1$ to $R^4$ each independently represent a hydrogen atom, an alkyl group having 1 to 20 carbon atoms that may have a substituent, a cycloalkyl group having 6 to 20 carbon atoms that may have a substituent, or an aryl group having 6 to 20 carbon atoms that may have a substituent, and $X^1$ and $X^2$ each represent an alkylene group having 2 to 10 carbon atoms that may have a substituent, a cycloalkylene group having 6 to 20 carbon atoms that may have a substituent, or an arylene group having 6 to 20 carbon atoms that may have a substituent.

10. The circularly polarizing plate according to claim 7, wherein the dihydroxy compound having the etheric oxygen atom comprises a dihydroxy compound represented by the following formula (3):

(3)

in the formula (3), $R^7$ represents a substituted or unsubstituted alkylene group having 2 to 10 carbon atoms, and p represents an integer of from 2 to 100.

11. The circularly polarizing plate according to claim 7, wherein the dihydroxy compound having the etheric oxygen atom has a cyclic ether structure.

12. The circularly polarizing plate according to claim 11, wherein the dihydroxy compound having the etheric oxygen atom has a plurality of cyclic structures.

13. The circularly polarizing plate according to claim 7, wherein the polycarbonate resin includes a structural unit derived from one or more kinds of dihydroxy compounds selected from the group consisting of a dihydroxy compound represented by the following formula (6) and a dihydroxy compound represented by the following formula (7):

$$HO-R_5-OH \quad (6)$$

in the formula (6), $R_5$ represents a substituted or unsubstituted cycloalkylene group of a monocyclic structure having 4 to 20 carbon atoms;

$$HO-CH_2-R_6-CH_2-OH \quad (7)$$

in the formula (7), $R_6$ represents a substituted or unsubstituted cycloalkylene group of a monocyclic structure having 4 to 20 carbon atoms.

14. The circularly polarizing plate according to claim 6, wherein the polycarbonate resin includes a structural unit derived from an aromatic dicarboxylic acid.

15. The circularly polarizing plate according to claim 6, wherein the polycarbonate resin includes a structural unit derived from an aromatic dihydroxy compound.

16. The circularly polarizing plate according to claim 15, wherein the aromatic dihydroxy compound comprises 2,2-bis(4-hydroxyphenyl)propane.

17. An organic EL panel, comprising the circularly polarizing plate according to claim 1.

* * * * *